United States Patent
Fenigstein et al.

(10) Patent No.: US 9,431,455 B2
(45) Date of Patent: Aug. 30, 2016

(54) BACK-END PROCESSING USING LOW-MOISTURE CONTENT OXIDE CAP LAYER

(71) Applicant: Tower Semiconductor Ltd., Migdal Haemek (IL)

(72) Inventors: Amos Fenigstein, Haifa (IL); Yakov Roizin, Afula (IL); Avi Strum, Haifa (IL)

(73) Assignee: Tower Semiconductor, Ltd., Midgal Haemek (IL)

( * ) Notice: Subject to any disclaimer, the term of this patent is extended or adjusted under 35 U.S.C. 154(b) by 12 days.

(21) Appl. No.: 14/536,649

(22) Filed: Nov. 9, 2014

(65) Prior Publication Data

US 2016/0133666 A1 May 12, 2016

(51) Int. Cl.
H01L 27/146 (2006.01)

(52) U.S. Cl.
CPC ..... *H01L 27/14685* (2013.01); *H01L 27/1462* (2013.01); *H01L 27/14689* (2013.01); *H01L 27/14692* (2013.01)

(58) Field of Classification Search
CPC combination set(s) only.
See application file for complete search history.

(56) References Cited

U.S. PATENT DOCUMENTS

| | | | |
|---|---|---|---|
| 4,952,523 A | 8/1990 | Fujii | |
| 5,094,984 A | 3/1992 | Liu et al. | |
| 5,139,971 A | 8/1992 | Giridhar et al. | |
| 5,716,891 A | 2/1998 | Kodama | |
| 6,071,784 A | 6/2000 | Mehta et al. | |
| 6,071,802 A * | 6/2000 | Ban | H01L 27/10894 257/E21.648 |
| 6,130,172 A | 10/2000 | Fuller et al. | |
| 6,524,911 B1 | 2/2003 | Mehta | |
| 6,803,266 B2 | 10/2004 | Solomon et al. | |
| 8,415,256 B1 | 4/2013 | Nickel | |
| 2001/0001075 A1 | 5/2001 | Ngo et al. | |
| 2003/0002658 A1 | 1/2003 | Belge et al. | |
| 2005/0006693 A1 | 1/2005 | Ngo et al. | |
| 2005/0145931 A1 | 7/2005 | Lee | |
| 2007/0170546 A1* | 7/2007 | Beach | H01L 27/016 257/532 |
| 2010/0078778 A1* | 4/2010 | Barth | H01L 21/568 257/659 |
| 2011/0206857 A1* | 8/2011 | Yim | H01L 21/02126 427/493 |

(Continued)

OTHER PUBLICATIONS

Burt, D., "Improving Radiation Tolerance in e2v CCD Sensors", Proceedings SPIE 7439, 2009, p. ??.

(Continued)

*Primary Examiner* — Mohammad Islam
*Assistant Examiner* — Ratisha Mehta
(74) *Attorney, Agent, or Firm* — Bever, Hoffman & Harms, LLP

(57) ABSTRACT

A method for fabricating image sensors and other semiconductor ICs that controls the amount of hydrogen generated during back-end processing. The back-end processing includes forming multiple metallization layers after front-end processing is completed (i.e., after forming the pre-metal dielectric), where each metallization layer includes a patterned aluminum structure, an interlevel dielectric (ILD) layer including TEOS-based oxide formed over the patterned aluminum structure. A cap layer including a low-moisture content oxide such as silane oxide (i.e., $SiO_2$ generated by way of a silane CVD process) is formed over at least one ILD layer. The cap layer serves as an etch-stop for the subsequently-formed metal layer of a next metallization layer by isolating the underlying ILD material from the plasma environment during aluminum over-etch, which significantly reduces the production and migration of hydrogen into front-end structures.

19 Claims, 6 Drawing Sheets

(56) References Cited

U.S. PATENT DOCUMENTS

2011/0312191 A1* 12/2011 Ohkura ............. H01L 21/02126
438/786
2012/0161255 A1* 6/2012 Gabert ................ B81C 1/00293
257/415
2012/0175736 A1* 7/2012 Watanabe ........... H01L 23/5223
257/532
2013/0092929 A1* 4/2013 Okazaki ............. H01L 29/7869
257/43
2013/0337650 A1 12/2013 Lee

OTHER PUBLICATIONS

Dryer, Ben, et al., "Gamma Radiation Damage Study of 0.18 μm CMOS Image Sensors", Proceedings of SPIE vol. 7742 77420E-1, 2010, 8 pages.
KLA-Tencor Corporation; PCT International Search Report dated Dec. 29, 2015 for Application No. PCT/US2015/051538 (P4500/KLA-067), 3 pages.

* cited by examiner

BACK-END PROCESSING USING LOW-MOISTURE CONTENT OXIDE CAP LAYER

FIELD OF THE INVENTION

This invention relates to semiconductor fabrications processes, and more particularly to back-end processing in a way that controls hydrogen production.

BACKGROUND OF THE INVENTION

Semiconductor device fabrication is the process used to create the integrated circuits (ICs) that are present in everyday electrical and electronic devices, and involves a multiple-step sequence of photolithographic and chemical processing steps during which electronic circuits are gradually created on a wafer made of pure semiconducting material (typically monocrystalline silicon). Modern integrated circuits are produced using, e.g., CMOS production flows (standardized processing sequences) including over 300 sequenced processing steps that are generally divided into Front-end-of-line (front-end) processes and Back-end-of-line (back-end) processes. Front end processing typically involves implanting dopants in the silicon wafer and depositing materials on the substrate that collectively form individual device components (e.g., transistors, capacitors, resistors, etc.). For example, front end processing for a non-volatile memory (NVM) transistor typically involves implanting n-type and p-type dopants into the silicon wafer to form source and drain doped diffusion regions that are disposed in electrically isolated well regions, forming gate oxides and field oxides on the silicon wafer surface, forming polycrystalline silicon (polysilicon) gate structures on the gate oxides, and forming a pre-metal dielectric ("D1" passivation) layer over the polycrystalline gate structures. Back end processing is the second portion of IC fabrication that involves forming a metallization structure including multiple (typically three to eight) metallization layers disposed in a stack, where each metallization layer includes a patterned metal (e.g., aluminum) "wire" layer and an interlevel dielectric (ILD) layer that serves to electrically isolate the patterned metal wires from the subsequently formed patterned metal wires of the next sequential metallization layer in the stack. The patterned metal wires of the various metallization layers interconnect the individual device components by way of metal "via" structures that are formed in conjunction with a contact etch process and extend through the pre-metal dielectric layer and previously formed ILD layers. The last (uppermost) patterned metal layer is covered by a final "topside stack" insulating material layer that is patterned by way of a "pad etch" process to make appropriate connections to the underlying IC, typically by way of connections to the uppermost patterned metal structure).

The ILD and topside stack are typically formed using one or more of Undoped silicate glass (USG), Fluorosilicate glass (FSG) and Borophosphosilicate glass (BPSG). A principal component of USG, FSG and BPSG is silicon dioxide ($SiO_2$), which is commonly used as dielectric material in semiconductor processing, where USG is essentially "pure" $SiO_2$, FSG is essentially $SiO_2$ containing fluorine, and BPSG is $SiO_2$ including both boron and phosphorous. Silicon dioxide ($SiO_2$) and silicon nitride ($Si_3N_4$, referred to herein as SiN for brevity) are the two prevalent dielectric material used in semiconductor processing. However, since the dielectric constant of silicon dioxide, which is about 3.9, is lower than that of silicon nitride, which is about 7.5, silicon dioxide is usually preferred for use as an insulation material between active regions or conductive lines, such the patterned metal layer found in back-end metallization structures. Two prevalent reactive gases used for forming silicon dioxide by chemical vapor deposition (CVD), which is commonly used in semiconductor processing, are silicon hydride (silane, $SiH_4$) and tetra-ethyl-ortho-silicate, (TEOS, $Si(OC_2H_5)_4$). Because the step coverage (gap filling) ability of $SiO_2$ formed using TEOS (referred to herein as "TEOS-based oxide") is better than $SiO_2$ formed using silane (referred to herein as "silane oxide"), TEOS-based oxide is preferred in semiconductor manufacture. TEOS and ozone ($O_3$) are sometimes used together as reactive gases in an atmospheric-pressure chemical vapor deposition (APCVD) for depositing USG to form shallow trench isolation (STI), inter-poly dielectrics (IPD) or cap layers on inter-level dielectric (ILD) layers in back-end structures.

The importance of hydrogen for the performance of CMOS devices is well known in semiconductor industry. A certain amount of hydrogen at the Silicon-Gate Oxide interface is needed to passivate the surface states (by forming Si—H complexes with dangling bonds). At the same time, excess amounts of hydrogen are responsible for device instabilities. For example, excess hydrogen may result in floating gate memory retention loss (e.g., hydrogen ions discharging single polycrystalline silicon ("single-Poly") floating gate memories; see U.S. Pat. No. 6,130,172, "Radiation hardened dielectric for EEPROM", R. Fuller et. al., which teaches that higher radiation hardness of BPSG with lower amounts of hydrogen was associated with lower amount of hole traps associated with hydrogen complexes). Hydrogen atoms are also known to interact with the bulk silicon defects created by ionizing radiation (see N. Shlopak, et. al. Physica Status Solidi, Volume 137, Issue 1, pages 165-171, 1993, which teaches that preliminary treatment of silicon in hydrogen plasma leads to a significant increase in radiation hardening). It was assumed that passivation of deep radiation defects occurred due to radiation activated hydrogen originating from inactive hydrogen containing species.

In the early stages of polysilicon gate MOS technology development (i.e., in the 1970s), Si—$SiO_2$ transistors with polycrystalline silicon (polysilicon) gates were found to be less stable than aluminum gate devices. Nevertheless, MOS performance was improved by a final alloy in hydrogen containing gases at 400° C.-450° C. Hydrogen treatment was also applied to imaging devices. U.S. Pat. No. 4,952,523 (Ichiro Fuji; Texas Instruments, 1990) discloses processing in hydrogen to decrease dark currents in charge coupled device (CCD) imagers. The embodiments include plasma treatment in hydrogen containing gases and placing aluminum on the interlayer dielectric with further thermal treatment. Though not directly mentioned in U.S. Pat. No. 4,952,523, it is apparent that the generation of hydrogen takes place if aluminum is disposed over the dielectric, possibly through a reaction with residual moisture contained in the dielectric. Involvement of Al as a hydrogen source was also disclosed in U.S. Pat. No. 6,803,266 to IBM (P. Solomon; Process for passivating the semiconductor-dielectric interface of a MOS device, 2003).

The results reported for CMOS image sensor (CIS) imagers and CCD not always show improvement when the amounts of hydrogen are high. In particular, increased dark current in the outermost pixels of the imager, as well as patterns related to peripheral layout features, were observed by D. Burt (see "Improving radiation tolerance in e2v CCD sensors", Proc. SPIE 7439, 2009). It was speculated that when more hydrogen exists in the vicinity of the Si—$SiO_2$ surface, this hydrogen combines with the Hydrogen atoms attached to the dangling bonds, thus de-passivating the surface (i.e., gaseous $H_2$ is out-diffused from the device). On the other hand, B. Dryer et. al. (Proc. of SPIE Vol. 7742 77420E-1, Gamma Radiation Damage Study of 0.18 µm CMOS Image Sensors) report better immunity of CIS image sensor arrays in the periphery. FIGS. 6(A) to 6(D) depict that the field of a CMOS image sensor irradiated with Gamma responds uniformly (compare FIGS. 6(A) and 6(B), which show the sensor without and with radiation at t=0). After 30 krad and 80 krad irradiation, white dots appear in the images, with the dots being more pronounced in the center of the image irradiated at 80 krad (FIG. 6(D)) than the dots in the image irradiated at 30 krad (FIG. 6(C)). Similar patterns were reported by other groups and different radiation types. Although the details of Si—H bonds de-passivation mechanism is not clear, the general understanding of Si—$SiO_2$ interface radiation damage is connected with hydrogen release (for example trapping of the generated by radiation hole at Si—H bond and atomic hydrogen release). If so, the amount of hydrogen in the vicinity of the dangling bond will be critical. For example, presence of hydrogen ions or atomic hydrogen could result in smaller efficiency of radiation—stimulated hydrogen de-trapping (detailed balance principle).

An early approach to controlling the generation/migration of hydrogen generated during back-end processing is to form a gettering/barrier layer on the pre-metal dielectric layer that serves to protect the underlying transistors and other IC elements before beginning back-end processing. Typical gettering materials include phosphosilicate glass (PSG) and BPSG. In addition, a layer of silicon nitride or silicon oxy-nitride is typically formed under the PSG or BPSG that serves as an etch stop during contact etch, and also contributes to the performance of the gettering/barrier layer. However, a problem with the gettering/barrier layer solution is that mobile hydrogen atoms are known to penetrate the gettering/barrier layer and diffuse to the floating gate of NVM devices, thus reducing floating gate storage capacity and causing reduced device operating parameters.

In order to prevent mobile atoms from affecting characteristics of the MOS transistors or memory cells, Mehta et al. (U.S. Pat. No. 6,071,784) provides a method of annealing the silicon nitride (SiN) layer and silicon oxy-nitride layer so as to eliminate charge loss from non-volatile memory devices. This approach involves forming a barrier layer or an etch stop layer that covers the MOS device and polysilicon floating gate structure, and then high temperature annealing at 750° C. is used to remove mobile atoms from the barrier layer or the etch stop layer. An additional dielectric layer is then formed on the barrier layer or the etch stop layer to protect the dehydrated barrier layer from moisture re-absorption. However, a disadvantage of this process is the addition of an extra high-temperature annealing process during the semiconductor fabrication process (especially in embedded processes) because the additional thermal budget alters the characteristics of semiconductor elements. In addition, this process does not account for the possibility that mobile hydrogen atoms and mobile ions may be re-adsorbed into the barrier layer, or may migrate/diffuse to the semiconductor elements under the barrier layer through the contact holes.

Tseng et al. (US. Pat. Application 20030003658) addresses some of the shortcoming mentioned above by providing a fabrication method for NVM devices that involves effectively preventing diffusion of the mobile ions or the hydrogen atoms into the memory device barrier by forming a spacer on the sidewall of the contact hole. This solution, however, has a disadvantage in that it adds a large number of process steps to the process flow, which greatly increases overall IC fabrication costs. In addition, the effect of the additional spacers on the reliability of the contact is questionable. Further, other penetration paths for hydrogen atoms/ions (e.g., diffusion through the gettering/barrier layer) are not addressed by this solution.

Additional proposed solutions to minimizing hydrogen atom/ion migration damage include methodologies for decreasing the amount of hydrogen or moisture contained in back-side materials, thus minimizing hydrogen atom/ion generation during back-side processing. One approach utilizes a "reflow" bake to achieve "silane Oxide" protection quality using a modified "TEOS-based oxide" in BPSG formation, but this approach cannot be used in CMOS process flows involving Salicide formation, and adds a high thermal budget. Other proposed solutions require too many additional steps to be added to a typical CMOS process flow (i.e., the resulting added cost and possible effect on the CMOS platform are major drawbacks), and the retention improvement is considered by the inventors to be unsatisfactory. Other proposed solutions claim charge retention improvement from the use of optimized SiN etch stop layers, but the present inventors determined that even optimized SiN adds another source of H+ ions, and even a "perfect" optimized SiN etch stop layer would not sufficiently curtail the generation/migration of back-end-generated ions. Other solutions propose improving the quality of the TEOS-based oxide used to form the first interlayer dielectric (ILD-1) by adding a gettering/barrier layer (e.g., BPSG, SiN, etc.), but the present inventors determined that these solutions have limited effectiveness because the H+ ions source is not limited to the ILD-1 layer, but rather related to the ILD layers of every metallization layer of the metallization structure stack. In summary, based on extensive research, the present inventors concluded none of the prior art solutions mentioned above serve to adequately reduce or eliminate the migration of back-end-generated hydrogen atoms/ions into front-end structures (e.g., polysilicon structures or doped diffusion regions), particularly H+ ions generated by back-end processing involving aluminum interactions with residual moisture disposed in ILD layers.

What is needed is a modified back-end processing methodology and associated modified back-end metallization structure that facilitates control over the generation and migration of mobile hydrogen atoms/ions, thus improving a semiconductor device's operating performance (e.g., improving image quality of CMOS image sensors).

SUMMARY OF THE INVENTION

The present invention is directed to a modified back-end processing method for use in the fabrication of semiconductor integrated circuits (ICs), and in particular to the fabrication of image sensors, that facilitates control over the amount of generated hydrogen by significantly reducing or eliminating hydrogen production during the formation of at least one metallization layer of the back-end metallization structure. According to the present invention, the amount of hydrogen atoms/ions produced during back-end processing is controlled by forming at least one lower metallization layer by, first, forming an inter-level dielectric (ILD) layer consisting of a TEOS-based oxide (e.g., one or more of USG or FSG), and then forming a high-density, low-moisture-content oxide cap layer such that the cap layer serves as an etch-stop for subsequent aluminum over-etch (i.e., such that, after subsequent aluminum etch is completed, the low-moisture-content oxide cap layer has a minimum "critical" thickness of 100 A (100 Angstroms) or greater). Specifically, at least one of the lower metallization layers (i.e., either the lowermost "M1" metallization layer or any subsequent metallization layer other than the uppermost/last metallization layer) includes a ILD layer consisting of TEOS-based oxide and a cap layer formed on an upper surface of the TEOS-based oxide ILD layer that comprises a high-density, low-moisture content oxide having a minimum thickness of 100 A or greater. The use of TEOS-based oxide to form the ILD layer assures superior coverage of underlying metallization structures due to its excellent gap filling characteristics. The price of using TEOS-based oxide is porosity and, as a result, higher hydrogen content due to absorbed moisture which is difficult to out-diffuse during typical semiconductor process flows. The cap layer is formed with a thickness greater than the penetration depth of the aluminum etch to prevent exposure of the ILD layer during aluminum over-etch (i.e., such that the etch front terminates at 100 A or greater from the upper surface of the ILD layer), thereby isolating the hydrogen-rich TEOS-based ILD material from the plasma environment generated during aluminum over-etch, whereby production of hydrogen atoms/ions that can migrate toward the front-end structures is minimized. By implementing the proposed ILD/cap layer arrangement in at least one of the metallization layers (or below the first metallization layer) using materials and processes already present in the fabrication environment (e.g., by forming the cap layer using silane, which is a gas used in most VLSI processes for different purposes, such as dielectrics formation, polysilicon deposition, etc.), the present invention provides a low-cost and highly effective method for controlling the creation of mobile hydrogen species and their migration/diffusion to the front end devices.

In an exemplary embodiment, the present invention is directed to a method for fabricating semiconductor devices utilizing fabrication processes typically used in standard CMOS process flows. The method begins with front-end processing include forming n-type or p-type doped diffusion regions disposed in a semiconductor substrate, polycrystalline silicon structures disposed over a surface of the substrate, salicide structures formed over the diffusion regions and/or polycrystalline silicon structures, and a pre-metal dielectric layer. After completion of the front-end structures, back-end processing is performed during which multiple metallization layers are sequentially formed in a stacked arrangement over the pre-metal dielectric layer, with each metallization layer including a patterned aluminum structure and an ILD layer consisting of a TEOS-based oxide (e.g., USG and/or FSG) that is formed over the patterned aluminum structure. The use of TEOS-based oxide as an ILD material is well known due to their superior gap-filling characteristics (i.e., conformity to complicated topologies), as compared to that of other oxides including silane oxide, SiN and silicon oxy-nitride. However, the present inventors have determined that, even when optimized (e.g., by reacting TEOS with ozone) and/or subjected to a dehydration process (e.g., performing a "densification" bake after deposition), TEOS-based oxides contain large amounts of moisture that produces hydrogen in charged and neutral states (i.e., atomic hydrogen and hydrogen positively charged ions) during each back-side aluminum etch process. The present inventors also determined that a significant amount of hydrogen generated during every back-side aluminum etch (i.e., not just the "M1" aluminum etch) migrates toward the front-end structures and deteriorates NVM operating performance, and that this hydrogen production is significantly reduced when a cap layer consisting of a high-density low-moisture content oxide, such as silane oxide or, is formed over the TEOS-based oxide ILD layer. In the case of NVM cells, this eliminates or reduces the number of charged hydrogen ions that can accumulate near the polysilicon floating gates, thus significantly improving memory retention over conventional back-side processing approaches. Thus, combining a TEOS-based oxide layer and a silane oxide layer in at least some of the metallization layers produces back-end processing characterized by a significant reduction is the generation and migration of hydrogen atoms/ions, and hence improved semiconductor devices. To facilitate a minimum cap layer thickness of 100 A after aluminum over-etch, the cap layers are formed using a layer of high-density silane oxide having a thickness in the range of 500 A to 5000 A, which is sufficient to provide the required "critical" minimum thickness after standard aluminum over-etch processes. By implementing the present invention using these materials and processes, the present invention can implemented with minimal modification to standard CMOS process flows, thereby minimizing fabrication costs and complexity.

According to an exemplary embodiment, cap layers consisting essentially of high-density silane oxide are provided over the ILD layers in each of the lower metallization layers (i.e., the first "M1" layer and all subsequent metallization layers except for the uppermost "last" metallization layer). Forming high-density low-moisture (e.g., silane oxide) cap layers on every lower metallization layer minimizes/eliminates hydrogen generation during all back-side aluminum etch processes, thereby maximizing device operating parameters (e.g., maximizing NVM floating gate storage capacity).

According to an alternative embodiment, cap layers consisting of silane oxide are provided in only one or some of the lower metallization layers, whereby hydrogen production during aluminum etch is reduced (i.e., in comparison to conventional arrangements that do not utilize high-density low-moisture content oxide cap layers) but not entirely eliminated. In an exemplary embodiment, a first cap layer comprising an optimized TEOS-based oxide (e.g., generated by way of reacting TEOS $(Si(OC_2H_5)_4)$ gas and ozone $(O_3)$ gas) is formed in the lowermost metallization layer, and a second cap layer silane oxide is formed in a next-sequential metallization layer, and any subsequent intermediate metallization layers are formed either with enhanced TEOS or silane oxide cap layers. As set forth above, hydrogen generation is relatively high in metallization layers that include enhanced TEOS cap layers (or no cap layer). Therefore, by forming a back-end metallization structure having a large number of metallization layers with TEOS (or no) cap layers and a small number of silane oxide cap layers, higher hydrogen generation/migration will be produced during back-end processing. Conversely, by forming a back-end metallization structure having a large number of metallization layers with silane oxide cap layers, lower hydrogen generation/migration will be produced during back-end processing. By forming at least one cap layer using silane oxide and a predetermined number of cap layers using TEOS-base oxide, control over the amount of hydrogen generated during back-end processing is provided. Thus, in cases where provides beneficial operating characteristics (e.g., in the case of image sensors, where limited hydrogen ion production is believed to be beneficial), hydrogen production is "tuned", e.g., by alternating high-density low-moisture content oxide cap layers with TEOS cap layers (e.g., forming "even"

numbered metallization layers with TEOS cap layers, and forming "odd" numbered metallization layers with silane oxide cap layers), whereby beneficial levels of hydrogen production are achieved and harmful levels of hydrogen are avoided. The inventors found that image sensor performance is connected with the amount of hydrogen in a certain area of the device (e.g., center or periphery of a CMOS image sensor array), and also to the form of hydrogen (atomic hydrogen, attached atomic hydrogen, H+ ions, etc.). By utilizing the methodologies associated with the present invention, the amount of hydrogen and its form can be precisely controlled ("tuned") to achieve both low initial dark currents and high radiation immunity.

According to yet another alternative practical embodiment, an additional high-density low-moisture content oxide cap layer is formed on the pre-metal dielectric layer (i.e., between the pre-metal dielectric layer and the lowermost metallization layer) in order to minimize hydrogen production during the first metal etch. In an exemplary embodiment, the pre-metal dielectric layer is formed using BPSG, USG or FSG, and the additional cap layer is formed by a layer of silane oxide. As with all subsequent high-density low-moisture content oxide cap layers, the additional cap layer is formed with a sufficient thickness such that, after the "M1" aluminum is deposited and etched, the remaining cap layer has a minimum thickness of 100 A or greater, thereby preventing exposure of the pre-metal dielectric layer to aluminum plasma.

In other alternative embodiments, either in place of or in addition to the additional cap layer formed on the pre-metal dielectric layer, an optional barrier layer (e.g., silicon nitride or silicon oxy-nitride having a thickness in the range 200-500 A) is formed on, under or in the BPSG or TEOS material forming a bulk of the pre-metal dielectric layer. The benefit achieved by providing this barrier layer is that, in combination with the one or more cap layers described above, the barrier layer further enhances the prevention of hydrogen migration from the back-end to front-end structures.

According to another alternative embodiment, the ILD layer of each lower metallization layer is annealed then planarized (e.g., using chemical-mechanical polishing (CMP)) before forming the cap layer. This anneal is performed to remove the residual water from the TEOS-based oxide to further reduce hydrogen generation. In another alternative, the ILD layer of at least one lower metallization layer is processed in hydrogen plasma before forming the cap layer in order to increase radiation hardening.

According to another alternative embodiment, the last passivation layer (i.e., the ILD layer of the uppermost metallization layer) is formed using a suitable dielectric material (e.g., e.g., silicon oxy-nitride having a thickness of 500-5000 A), and is then subject to annealing at temperatures in the range 350-450° C. In one specific embodiment, this final anneal process is performed before the pad etch (final metal etch) in order to decrease the amount of hydrogen in the uppermost ILD (i.e., to shift the diffusion of residual hydrogen in the direction of outside the chip per the detailed balance principle). In an alternative specific embodiment, this final anneal process is performed after pad etch to decrease the amount of hydrogen in the passivation dielectric.

According to another alternative embodiment, the last passivation layer (i.e., the ILD layer of the uppermost metallization layer) is exposed to UV radiation having wavelengths below 250 nm in the plasma chamber either during deposition of the passivation dielectric or pad opening stages (i.e., "in process" UV treatment through tuning the etch/ash equipment), and/or after back-end processing is completed (i.e., "after process" UV irradiation by vacuum UV at 200-450° C.). The inventors determined that both "in process" and "after process" UV light strongly changes the CMOS performance. The UV radiation treatment is believed to improve imaging devices (e.g., CISs and CCDs), but may be detrimental to charge retention in non-volatile memory devices.

According to yet another alternative embodiment, during back-end processing of an image sensor, in addition to the methodologies set forth above, the patterned aluminum structure of at least one metallization layer includes both functional patterned aluminum structures that are coupled to the array of image sensing pixels over an interior of a rectangular imaging region, and non-functional "dummy" patterned aluminum structures (i.e., metal patterns that are not coupled to the array of image sensing pixels, and are disposed over an exterior peripheral region surrounding the rectangular imaging region. In a specific embodiment, after the functional and non-functional patterned aluminum structures are formed, the structure is annealed to remove residual water from the underlying TEOS-based oxide, and then the non-functional patterned aluminum structures are removed using conventional techniques. The purpose of temporarily forming the "dummy" patterned aluminum structures in this manner is to generate the same level of hydrogen ions (i.e., due to aluminum etch) in regions outside the periphery of the imaging region as generated inside the region, thereby avoiding the image forming problems described above.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
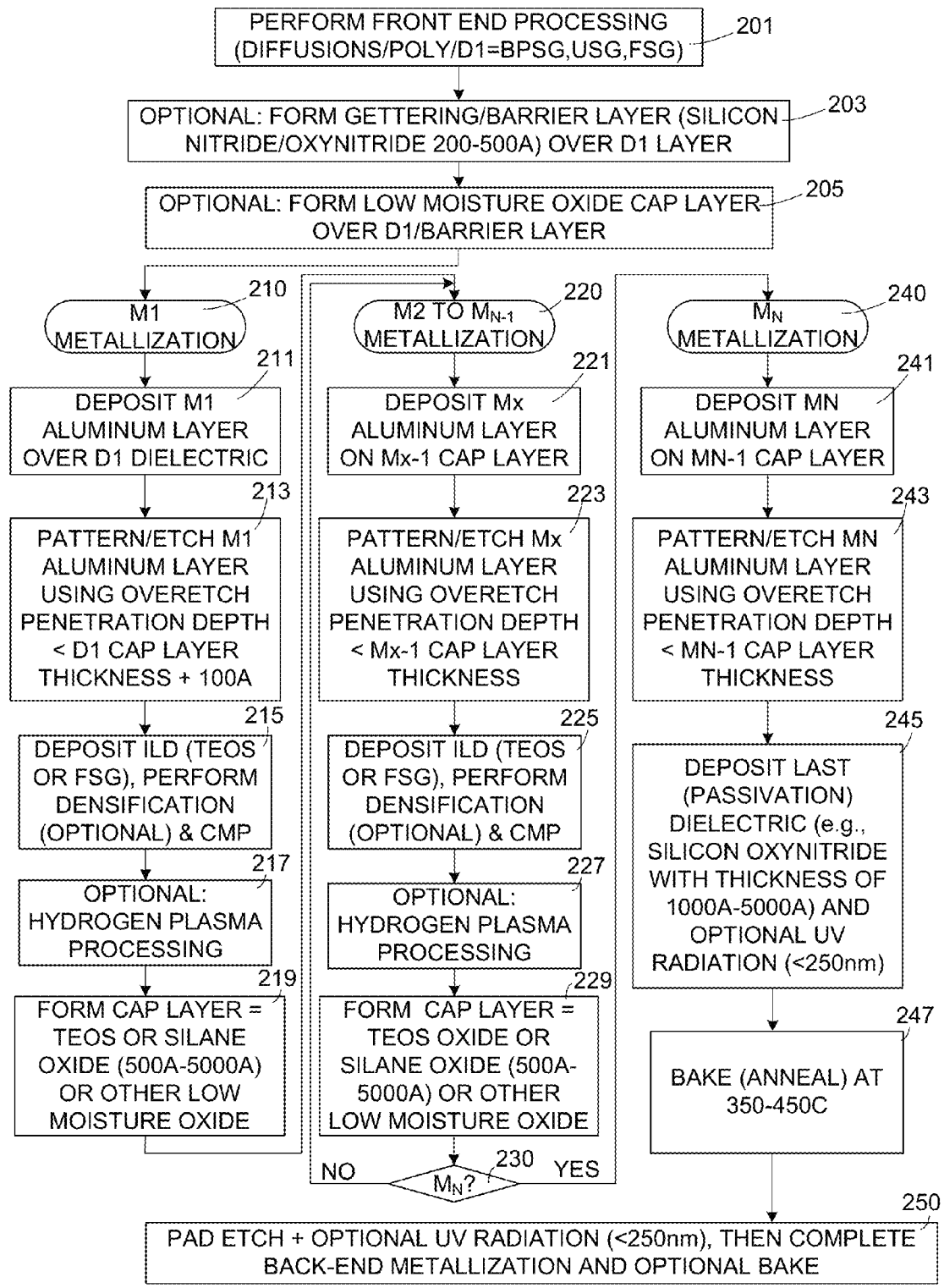
FIG. 1 is a flow diagram showing a method for fabricating a semiconductor IC device according to an embodiment of the present invention.

The present invention relates to an improvement in back-end processing and to semiconductor integrated circuit devices fabricated with a back-end structure formed by the improved back-end process. The following description is presented to enable one of ordinary skill in the art to make and use the invention as provided in the context of a particular application and its requirements. As used herein, directional terms such as "upper", "uppermost", "lower", and "lowermost" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The modified back-end processing method according to the present invention is based on research and observations by the present inventors regarding standard CMOS process flows using back-end processing techniques including patterned aluminum structures and TEOS-based oxide ILD layers. Specifically, typical TEOS-based oxide deposition processes involves heating the wafer surface to 400° C. and reacting TEOS with oxygen according to the reaction of Equation 1:

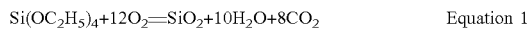

$$Si(OC_2H_5)_4 + 12O_2 = SiO_2 + 10H_2O + 8CO_2 \qquad \text{Equation 1}$$

The inventors observed that ILD layers formed using the above TEOS-based oxide process (and even optimized TEOS-based oxides formed using ozone) contain large amounts of moisture (i.e., a significant portion of the "$10H_2O$" in Equation 1 remained in the $SiO_2$), and that this high moisture content generated hydrogen atoms/ions during aluminum over-etch during back-end processing. Further, due to the porous structure of TEOS-based oxides, even if an anneal is performed to remove the moisture, significant moisture returns to TEOS-based oxides during subsequent process stages. The inventors also observed that a significant amount of generated hydrogen migrated to front-end structures during aluminum over-etch in "upper" metallization layers, meaning that the hydrogen generation/migration issue occurs at each metallization layer. Moreover, attempts to reduce the amount of moisture remaining in TEOS-based oxide by baking the ILD material at temperatures of up to 450° C. prior to aluminum deposition were found to be ineffective (i.e., the inventors found this "drying" process leaves residual moisture amounts of up to 10 to 15 atomic percent in the TEOS-based oxide material). The inventors also observed that the generation of hydrogen atoms/ions during aluminum over-etch was greatly reduced when the ILD layer was formed using a high-density, low-moisture-content oxide material such as high-density low-moisture silane oxide produced by heating the wafer surface to temperatures in the range of 350 to 450° C. and reacting silane with oxygen according to Equation 2:

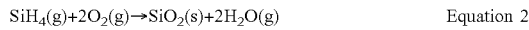

$$SiH_4(g) + 2O_2(g) \rightarrow SiO_2(s) + 2H_2O(g) \qquad \text{Equation 2}$$

However, the formation of ILD layers using low-moisture-content oxides is known to be unacceptable due to the poor gap-filling characteristics of known low-moisture-content oxides.

Based on the above observations, the inventors concluded that adequate reduction or elimination of damaging hydrogen atoms/ions during back-end processing can be economically and efficiently achieved when each metallization layer includes both a TEOS-based oxide "lower" ILD layer in order to achieve excellent gap filling, and also a cap layer formed over ILD layer that consists of a low-moisture-content oxide (e.g., silane oxide) and has a sufficient thickness (i.e., 100 A or greater) to prevent exposure of the underlying TEOS-based oxide during aluminum over-etch. As used herein, the phrase "high-density low-moisture content oxide" is defined as an oxide material having a maximum moisture content of four atomic percent or less (e.g., in the range of one to four atomic percent), and a minimum density of 2.2 grams per cubic centimeter ($gm/cm^3$) or greater. In the exemplary embodiments set forth below, a high-density, low moisture silane oxide (i.e., silane oxide produced by heating a wafer surface to temperatures in the range of 350 to 450° C. and reacting silane with oxygen according to Equation 2, above) is primarily utilized to form suitable cap layers. However, unless otherwise specified the phrase "high-density low-moisture content oxide" is not intended to be limited solely to silane oxide, and may include another suitable oxide materials such as high-density, low moisture silicon oxy-nitride (i.e., oxy-nitride formed using a plasma process, e.g., by adding $N_2$ or NO to silane oxide).

Figure 2:
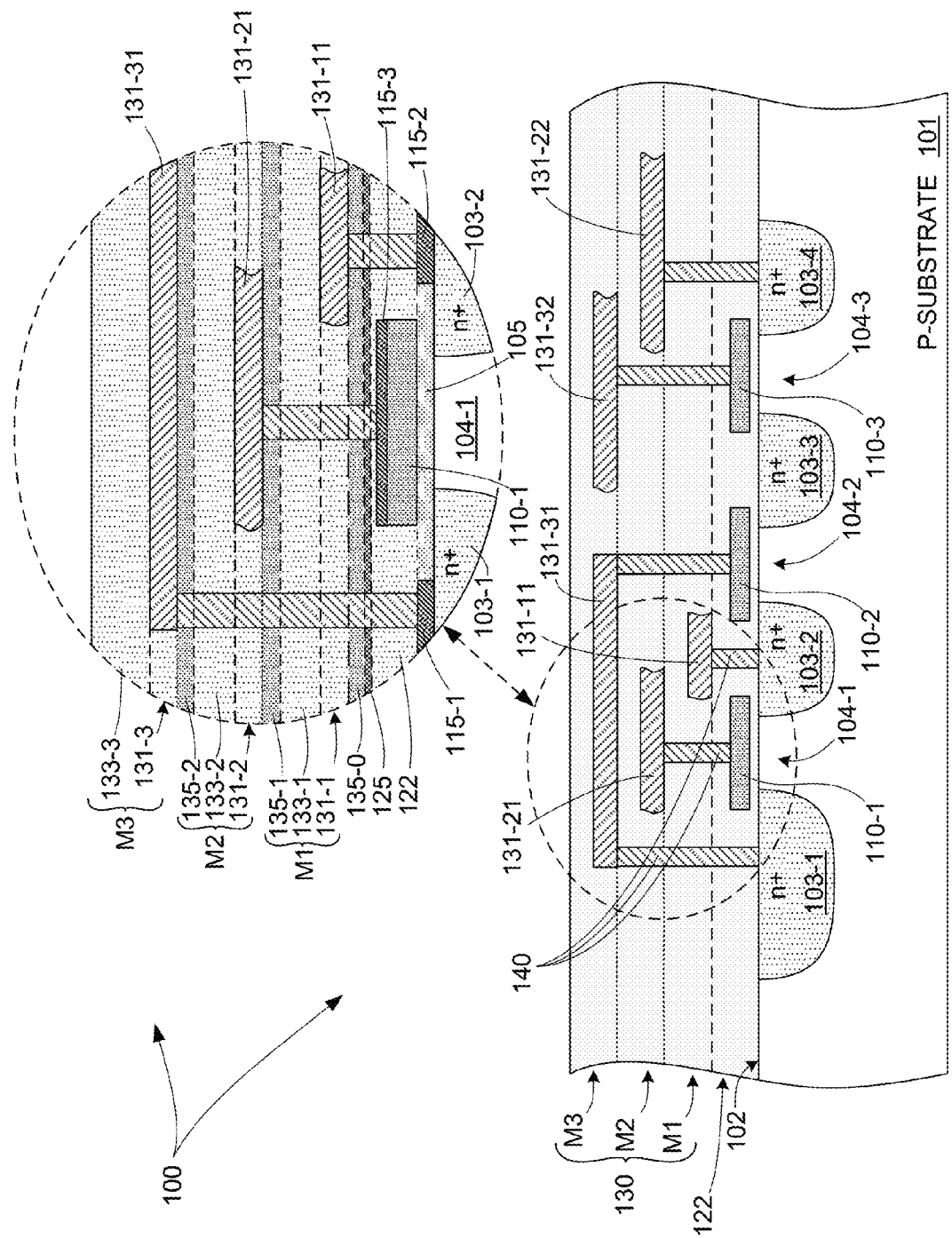
FIG. 2 is a cross-sectional view showing a pixel of an image sensor formed in accordance with the method of FIG. 1.

According to an exemplary embodiment set forth below, the present invention is described with reference to the fabrication of a semiconductor integrated circuit (IC) including an image sensor using a CMOS process flow in which the back-end process is modified to control the amount of hydrogen generated during aluminum over-etch, whereby dark current in the image sensor is decreased and radiation hardness is improved by way of utilizing a cap layer consisting of low-moisture-content oxide in at least one of the metallization layers forming the back-end metallization structure. Specifically, FIG. 1 is a flow diagram showing a simplified CMOS process flow including a modified back-end processing method according to an embodiment of the present invention, and FIG. 2 shows a portion of a semiconductor IC 100 including a single image sensor "pixel" that is generated by way of the process flow shown in FIG. 1. Although aluminum is utilized in this example, and all observations are based on the generation and migration of hydrogen during aluminum over-etch, the present invention is currently believed to be useful when other metals are utilized during back-end processing.

The flow diagram of FIG. 1 generally includes front-end processing (block 201) followed by optional pre-metal dielectric processing (blocks 203 and 205), then back-end processing that includes the processes illustrated in the three columns located in the center of FIG. 1, where the left column (i.e., below block 210) including processes associated with generating the lowermost (first, or "M1"), the center column (i.e., below block 220) including processes associated with generating intermediate ("M2 to MN−1") metallization layers, and the right column (i.e., below block 240) including processes associated with generating the uppermost/last ("MN") metallization layer. Referring to FIG. 2, structures generated by front-end processing, which are described in additional detail below and include a pre-metal dielectric ("D1" passivation) layer 122, are disposed in the lower portion of the figure, and back-end processing generates metallization structure 130, which in the exemplary embodiment includes lowermost (first) metallization layer M1, intermediate metallization layer M2, and uppermost (last) metallization layer M3, wherein layers M1 to M3 are sequentially formed in a stack arrangement over pre-metal dielectric layer 122. Similar to conventional back-end processing, each metallization layer M1 to M3 includes a patterned metal structure that is covered by an associated interlevel dielectric (ILD) layer. For example, lowermost metallization layer M1 includes patterned metal structure 131-1 covered by ILD layer 133-1, middle metallization layer M2 includes patterned metal structure 131-2 covered by ILD layer 133-2, and uppermost metallization layer M3 includes patterned aluminum structure 131-3 covered by ILD layer 133-3. According to the exemplary embodiment, patterned metal structures 131-1 to 131-3 comprise aluminum, at least one of ILD layers 133-1 and 133-2 consist of a TEOS-based oxide (e.g., USG and/or FSG), and at least one of cap layers 135-1 and 135-2 consists of silane oxide (or another high-density low-moisture content oxide). In a preferred embodiment, after forming each ILD layer 133-1 and 133-2, industry well known densification methods are utilized to decrease moisture content of the TEOS-based oxide material, and then chemical-mechanical polishing (CMP) is utilized to planarize the upper surface of ILD layers 133-1 and 133-2. Silane oxide is then deposited to form cap layers 135-1 and 135-2 on ILD layers 133-1 and 133-2, respectively, wherein each cap layer 135-1 and 135-2 has an optimized thickness in the range of 500 A (angstroms) to 5000 A. The combined use of TEOS-based oxide and silane oxide produces a superior ILD structure in that the use of TEOS-based oxide facilitates excellent gap filling over patterned metal structures 131-11 and 131-21, and the use of silane oxide cap layers 135-1 and 135-2 having the optimized thickness were found to significantly reduce the generation and migration of hydrogen atoms/ions into front-end structures. Based on the inventor's current understanding, the significant improvement is produced by very low hydrogen generation during aluminum over-etch due to the low moisture content of the silane oxide produced in accordance with Equation 2 (above), because Si—H bonds in silane oxide are a kind of internal getter, and because moisture is not absorbed from the underlying TEOS (i.e., the silane oxide acts as a barrier for moisture). The resulting silane oxide cap layer thus inherently contains significantly less moisture than TEOS-based oxides.

In accordance with an aspect of the present invention, the main purpose of the low-moisture content cap layer differs from that of capping layers found in the prior art. The purpose of the capping layers in the prior art back end integration schemes was to improve the properties of the first dielectric stack which includes BPSG (the layer that is used for gettering). Hence, these conventional capping layers were employed only after gettering/barrier layer. In contrast, the main purpose of the high-density low-moisture content oxide cap layers of the present invention is to isolate the TEOS-based oxide of the ILD layer from the plasma environment during aluminum over-etch. The present inventors observed that it was critically important to adjust the thickness of cap layer thickness to comply with the aluminum over etch penetration depth. If, during the Al over-etch, the etch front stops in the silane oxide of the cap layer with a sufficient "buffer" (i.e., with a minimum critical thickness of silane oxide of 100 A or greater), the amount of hydrogen generated by the reaction between residual moisture/hydrogen and Al) is small. However, if the etch front approaches/reaches the FSG/USG, generation of hydrogen strongly increases. Accordingly, it is a feature of the present invention that cap layers 135-1 and 135-2 have a minimum "critical" thickness (i.e., in regions of the silane oxide that are etched during aluminum over-etch) of 100 A or greater.

The process flow of FIG. 1 will now be described in additional detail with reference to FIGS. 2 and 3(A) to 3(C).

Referring to the upper portion of FIG. 1, the process flow begins with front-end processing (block 201), which generally includes forming doped regions in a semiconductor substrate (wafer), the formation of polycrystalline silicon (polysilicon) gate structures, the generation of salicide structures, and the formation of a pre-metal dielectric ("D1" passivation) layer. Simplified exemplary structures produced during front-end processing are illustrated the lower portion of FIG. 2. For example, doped diffusion regions (e.g., n+ regions 103-1, 103-2, 103-3 and 103-4) are formed in a p-type semiconductor substrate 101, then polycrystalline silicon structures (e.g., gate structures 110-1, 110-2 and 110-3) are formed on respective gate oxide structures that are disposed on an upper surface 102 (e.g., as indicated in the bubble at the top of FIG. 2, gate structure 110-1 is formed on oxide structure 105), salicide structures are formed on upper surface 102 and on the polycrystalline silicon structures (e.g., as indicated in the bubble at the top of FIG. 2, salicide structures 115-1 and 115-2 are formed over n+ regions 103-1 and 103-2, respectively, and salicide structure 115-3 is formed on gate structure 110-1), and then pre-metal dielectric layer 122 comprising BPSG or other TEOS-based oxide (e.g., USG, FSG, or a combination thereof) having a thickness in the range of 5000 A and 15000 A is deposited over the polysilicon gate structures and upper surface 102 and then planarized. In one embodiment, the front-end processing described above is conducted according to known techniques. The disclosed image device and associated configuration are merely provided to illustrate the present invention in an exemplary context, and are not intended to be limiting. The salicide structures are optional and may be omitted in some embodiments.

Referring to block 203 in FIG. 1 and to the lower portion of FIG. 2, according to an embodiment, an optional gettering/barrier layer 125 is formed on/over dielectric layer 122. In alternative embodiments (not shown), optional gettering/barrier layer 125 is disposed below/under or inside (i.e., in between two layers of material that form) dielectric layer 122. In each of these cases, optional gettering/barrier layer 125 is disposed between polycrystalline silicon structures 110-1 to 110-3 and lowermost metallization layer M1. In an exemplary embodiment, gettering/barrier layer 125 consists essentially of either silicon nitride or silicon oxy-nitride and has a thickness in the range 200-500 A, and serves a purpose similar to that of conventional barrier layers (i.e., resisting penetration of ions to the front-end devices, and also acting as an etch stop layer during contact etch).

Referring to block 205 in FIG. 1, according to another embodiment, an "additional" high-density low-moisture content oxide cap layer 135-0 is formed over pre-metal dielectric layer 122 (i.e., between pre-metal dielectric layer 122 and lowermost metallization layer M1), and serves the same purpose as that of cap layers 135-1 and 135-2 disposed in the metallization layers (i.e., to minimize hydrogen production during etch of the first aluminum layer 131-1, as described below). In an exemplary embodiment, pre-metal dielectric layer 122 is formed using BPSG, USG or FSG, and additional cap layer 135-0 is formed by a layer of silane oxide. As with all subsequent high-density low-moisture content oxide cap layers, additional cap layer 135-0 is formed with a sufficient thickness (e.g., with a thickness in the range of 500 A and 5000 A) such that, after "M1" aluminum layer 131-1 is deposited and etched, remaining portions of additional cap layer 135-0 have a minimum thickness of 100 A or greater, thereby preventing exposure of pre-metal dielectric layer 122 to aluminum plasma.

Referring to the leftmost column in FIG. 1 (i.e., below block 210), after formation of pre-metal dielectric layer 122 (and optional "additional" cap layer 135-0 and/or barrier layer 125) is completed, formation of lowermost metallization layer M1 begins by depositing the first "M1" aluminum layer on the M1 cap layer (block 211), and then patterning/etching the first aluminum layer (block 213) to form patterned aluminum layer 131-1. ILD layer 133-1 is then formed over patterned aluminum layer 131-1 (block 215), optional hydrogen plasma processing is performed (block 217), and then cap layer 135-1 is formed (block 219).

Figure 3A:
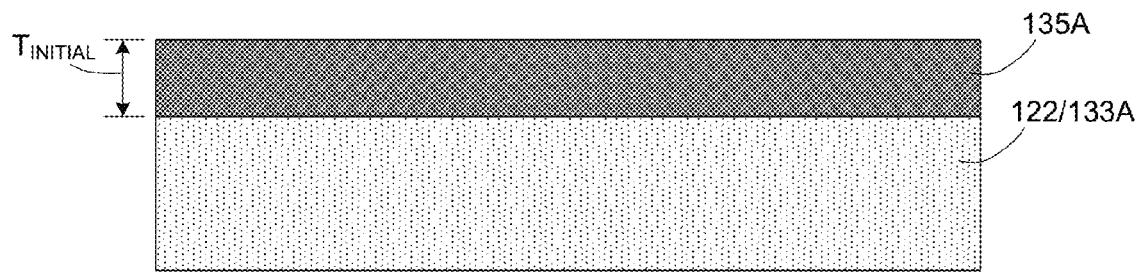
FIGS. 3(A), 3(B) and 3(C) are simplified cross-sectional views showing formation of a metal structure on a cap layer according to the method of FIG. 1.
Figure 3B:
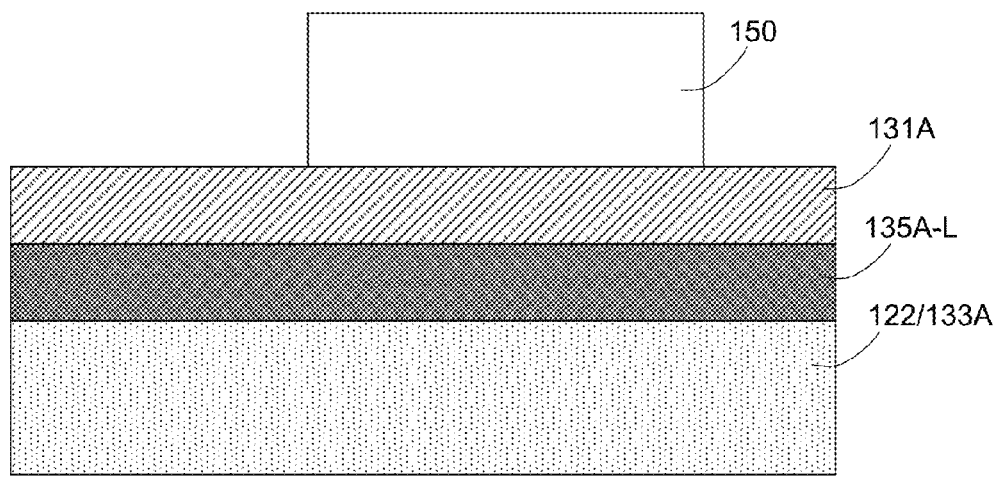
Figure 3C:
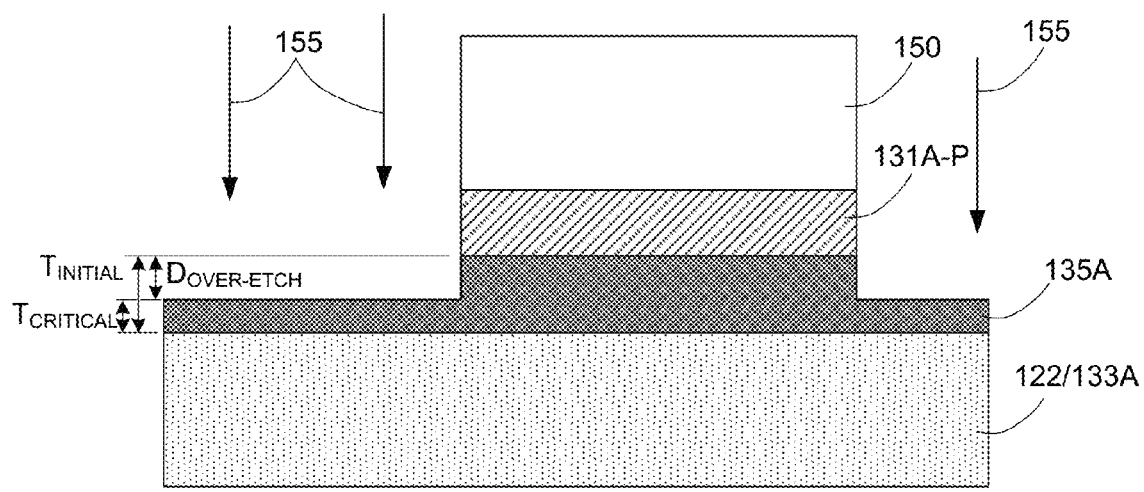

FIGS. 3(A) to 3(C) depict the deposition and patterning of an aluminum layer 131A on a previously formed cap layer 135A according to an exemplary embodiment of the present invention. The process illustrated in FIGS. 3(A) to 3(C) is applicable to the case where first aluminum layer 131-1 is deposited and patterned on "additional" cap layer 135-0 is present on pre-metal dielectric layer 122 (i.e., in this case, the dielectric layer disposed under cap layer 135A is dielectric layer 122), and is also applicable to subsequently deposited/patterned aluminum layers formed on the cap layer of previous metallization layers (e.g., the deposition/patterning of aluminum layer 131-2/131A on cap layer 135-1/135A, which is disposed on ILD layer 133-1/133A).

Referring to FIG. 3(A), metallization layer 131A (e.g., first metallization layer 131-1) is formed by depositing aluminum using known techniques over pre-metal dielectric layer 122 (i.e., on "additional" cap layer 135-0, as indicated in FIG. 2). Cap layer 135A (which in this case represents optional "additional" cap layer 135-0 of FIG. 2) is provided with an initial thickness $T_{INITIAL}$ in the range of 500 A to 5000 A, and is formed over pre-metal dielectric layer 122. As indicated in FIG. 3(B), aluminum layer 131A is then deposited on cap layer 135A, and a mask 150 (e.g., photoresist material) is then deposited and patterned using known techniques. As indicated in FIG. 3(C), exposed portions of aluminum layer 131A are then etched using a suitable etchant 155 according to known techniques to form aluminum metallization structures (e.g., aluminum wires 131-11 and 131-12 shown in FIG. 2). Note that cap layer 135A is formed such that initial thickness $T_{INITIAL}$ is greater than a sum of over-etch penetration distance $D_{OVER-ETCH}$ and a minimum critical thickness $T_{CRITICAL}$ of cap layer 135A. If the etch front penetrates through cap layer 135A to ILD layer 133A, hydrogen is generated due to the reaction of water molecules with aluminum plasma. The generated hydrogen can be in charged and neutral states (atomic hydrogen and hydrogen positively charged ions). Both types of species can diffuse in the direction of the active devices (transistors, resistors, etc. formed in silicon) and change their parameters. In particular, charged positive ions can accumulate near the floating gates of memory devices and effectively decrease the charge on the floating gates (initially programmed, with negative charge in the polysilicon floating gate). The same increased accumulation of hydrogen happens in the peripheral areas of CIS image sensors. By forming cap layer 135A such that, at the end of the aluminum over-etch the etch portion of cap layer 135A retains a minimum critical thickness $T_{CRITICAL}$ of 100 A or greater between the etch front and the upper surface of dielectric/ILD layer 122/133A, the generation of hydrogen atoms/ions is greatly reduced.

Referring to block 215 in FIG. 1, after first patterned metal layer 131-1 is completed, a first ILD (passivation dielectric) layer is formed (ILD layer 133-1 in FIG. 2) by depositing TEOS-based oxide (e.g., USG and/or FSG) having a thickness in the range of 5000 A and 15000 A. According to a specific embodiment, ILD layer 133-1 is then subjected to optional "densification" (annealing), and then planarized using, for example, chemical mechanical polishing (CMP). The densification anneal is performed to remove the residual water from the TEOS-based oxide in order to further reduce hydrogen generation during subsequent aluminum etch.

Referring to block 217 in FIG. 1, ILD layer 133-1 is subjected to optional processing in hydrogen plasma before forming cap layer 135-1. Hydrogen plasma is utilized in order to increase radiation hardening, and is performed according to known techniques.

Referring to block 219, first cap layer 135-1 is then formed on ILD layer 133-2, e.g., by forming silane oxide having a thickness in the range of 500 A to 5000 A on first ILD layer 133-1. The silane oxide is generated in accordance with the reaction of Equation 2 (above). Following formation of cap layer 135-1, via formation is performed in accordance with known techniques. For example, to form vertical metal "via" connecting structures 140 that are shown in FIG. 2, a via mask is formed, an etch is performed through the silane oxide to form via openings, the via openings are filled with tungsten, tungsten CMP is performed, then next-layer metal deposition is performed. Note that the thickness of the cap layer is predicated in part on the tungsten etch and CMP.

Referring to the middle column in FIG. 1, after formation of the lowermost "M1" metallization layer is completed, formation of the middle ("M2 to $M_{N-1}$") metallization layer (block 220) begins by depositing the second "M2" aluminum layer on the M1 cap layer (block 221), and then patterning/etching the second aluminum layer using an etch process having an over-etch penetration depth that is less than the cap layer thickness of M1 cap layer (block 223). Referring to FIG. 2, metallization layer M2 forms the middle (intermediate) metallization layer of image sensor 100, and includes patterned aluminum layer 131-2 covered by ILD layer 133-2, and cap layer 135-2 formed on ILD layer 133-2. In the manner described above with reference to FIGS. 3(A) to 3(C), metallization layer 131-2 is formed by depositing aluminum on cap layer 135-1 of metallization layer M1, and then etching the aluminum layer to form aluminum metallization structures (e.g., aluminum wires 131-21 and 131-22) using an etch process that does not penetrate through cap layer 135-1. Referring to block 225 in FIG. 1, after the second patterned metal layer is completed, a second ILD (passivation dielectric) layer is formed (ILD layer 133-2 in FIG. 2) by depositing TEOS-based oxide (e.g., USG and/or FSG) having a thickness in the range of 5000 A to 15000 A, followed by optional densification and planarization by CMP. An optional hydrogen plasma process is then performed in the manner described above (block 227). Next, a second cap layer 135-2 is formed on ILD layer 133-2, e.g., by forming silane oxide having a thickness in the range of 500 A to 5000 A, preferably in the range of 2500 A to 5000 A. Following formation of cap layer 135-2, via formation is performed in the manner described above followed by tungsten CMP.

Referring again to blocks 219 and 229, in accordance with alternative embodiments, one or more of the first "M1" metallization layer or the intermediate metallization layers is optionally formed using TEOS-based oxide in order to "tune" the amount of hydrogen generated during back-end processing. That is, in cases where the generation of hydrogen is to be minimized in order to maximize device operating parameters (e.g., in order to maximize NVM floating gate storage capacity), all of the lower cap layers (e.g., both cap layer 135-1 and 135-2 in the example of FIG. 2) are formed using silane oxide in order to minimize hydrogen generation/migration. However, in cases where limited hydrogen production during back-end processing provides beneficial operating characteristics (e.g., in the case of image sensors, where limited hydrogen ion production is believed to be beneficial), the generation of hydrogen during back-end processing is "tuned", for example, by alternating high-density low-moisture content oxide cap layers with (optimized or otherwise) TEOS-based oxide cap layers (e.g., forming the cap layers of "even" numbered metallization layers, such as cap layer 135-2, using TEOS-based oxide, and forming the cap layers of "odd" numbered metallization layers, such as cap layer 135-1, using silane oxide cap layers), whereby beneficial levels of hydrogen production are achieved and harmful levels of hydrogen are avoided.

Referring to lower portion of the middle column in FIG. 1, after completing the formation of an intermediate metallization layer (including via etch/formation), the process of blocks 221 to 229 is repeated for each additional intermediate metallization layer (i.e., "NO" branch of decision block 230), if any additional metallization layers are present in the back-end structure. In three-layer metallization structure 130 illustrated in FIG. 2, only one intermediate metallization layer (i.e., layer M2) is formed, so blocks 221 to 229 are performed only once. In other embodiments including four or more metallization layers, blocks 221 to 229 are repeated for each metallization layer disposed between the first (lowermost) and last uppermost) metallization layers.

Referring to the right side of FIG. 1, after all intermediate metallization layers are formed (i.e., "YES" branch of decision block 230), formation of the uppermost/last "$M_N$" metallization layer (block 240) begins by depositing the last "$M_N$" aluminum layer on the second-to-last "$M_{N-1}$" cap layer (block 241), and then patterning/etching the last aluminum layer using an etch process having an over-etch penetration depth that is less than the cap layer thickness of second-to-last "$M_{N-1}$" cap layer (block 243). Referring to FIG. 2, metallization layer M3 forms the last metallization layer of image sensor 100, and includes patterned aluminum layer 131-3 covered by uppermost/last ILD layer 133-3. In the manner described above, metallization layer 131-3 is formed by depositing aluminum on cap layer 135-2 of metallization layer M2, and then etching the aluminum layer to form aluminum metallization structures (e.g., aluminum wires 131-31 and 131-32) using an etch process that does not penetrate through cap layer 135-2. Referring to block 245 in FIG. 1, after the last patterned metal layer is completed, a last ILD (passivation dielectric) layer is formed (ILD layer 133-3 in FIG. 2), for example, by depositing a silicon oxy-nitride layer having a thickness in the range of 500 to 5000 A. As indicated in FIG. 2, there is no cap layer over last ILD (passivation dielectric) layer 133-3. Nevertheless, as indicated in block 247 (FIG. 1), in one embodiment a bake (anneal) at temperature in the range 350-450° C. is performed to decrease the amount of hydrogen in last ILD layer before pad etch. The purpose of this anneal is to shift the diffusion of residual hydrogen to the outside of the wafer. After formation of the uppermost/last ILD layer, pad etch is performed, and then back-end processing is completed by way of forming final contact structures according to known techniques (block 250).

Referring again to FIG. 1, block 245 includes optional "in process" UV radiation treatment (i.e., "optional UV radiation<250 nm") during deposition of the last passivation layer (i.e., ILD layer 133-3 in FIG. 2), and block 250 includes "after process" UV treatment during the final stages of back-end processing. According to another aspect of the present invention, these "in process" and "after process" UV light treatments are utilized to strongly change CMOS performance, and in particular to decrease dark currents and increase radiation hardness of image sensors. In one embodiment, "in-process" UV radiation (i.e., with UV light purposely enhanced in the plasma chamber during deposition of the last ILD/passivation dielectric, and/or during pad opening) is performed using emitted light wavelengths below 250 nm and irradiating the wafer for 10-30 min. Alternatively, "after process" UV radiation is performed after the completion of the fabrication process using UV light with wavelengths below 250 nm, and is either followed by or accompanied with an annealing process (bake) at 200-450° C. Using one or both of these UV treatments, the present inventors found that it is possible to decrease the dark current and increase radiation hardness in image sensors fabricated by CMOS process flows. Positive hydrogen ions are formed during such irradiation. Experiments with floating gate NVM memory devices fabricated in the same CMOS process flow and irradiated after the completion of the technological process showed that UV irradiation during the fabrication process enhanced the subsequent effects of FG charge loss. The effect was proportional to the severity of retention loss in corresponding splits (without irradiation). It is suggested that poor performing splits contain higher amounts of neutral hydrogen, while UV irradiation is believed to ionize hydrogen atoms making them positively charged. In particular, the intensity of UV irradiation at the passivation deposition and passivation etch was shown to be the major player in the balance between charged and not charged hydrogen species. Thus, the optional "in process" UV radiation treatment is typically utilized in the production of image sensors, but not in the production of non-volatile memory cells.

As set forth above, tuning of hydrogen content in the back-end processing is achieved by using one or more of utilizing TEOS and silane cap layers at different metallization levels, using cap layers having a thickness in the range of 500 A to 5000 A to modulate the critical thickness, performing bakes of the ILD material before deposition of the cap layers to reduce hydrogen content, providing barrier layers in the first dielectric layer, and using "in process" and "after process" UV treatment. A combination of the above-mentioned "tools" was utilized to fabricate CIS pixels having dark current levels at the level of single electrons per second, and radiation hardness exceeding 100 krad TID (gamma ray irradiation with $Co^{60}$).

Those skilled in the art will recognize that the proposed methods described herein can be applied to harden semiconductor integrated circuit devices to different types of radiation, including ionizing damage (e.g. gamma and X-rays), neutron radiation (displacement damage), proton radiation (combined damage: both ionization of bonds at the interfaces and displacing atoms in silicon). The method can be used efficiently in all cases when passivation of defects by hydrogen takes place.

The methods for controlling hydrogen generation during back-end processing described above with reference to the formation of CMOS image sensors can also be applied to other CMOS devices, such as non-volatile memory (NVM) devices and other transistors. In addition, the methods described herein may be utilized in the fabrication of various types of image sensors (e.g., CMOS image sensor (CIS) and a charge-coupled device (CCD) image sensors), and to image sensors utilized in non-visible-light imaging applications (e.g., CMOS radiation detector circuits such as those used in applied particle physics, nuclear physics, or nuclear engineering). Moreover, the methods described herein may be optimized to address other effects related to hydrogen generation during CMOS fabrication (such as hot carrier immunity, Negative-bias temperature instability (NBTI), etc.). In particular, it was observed that generation of large amounts of positive ions by introducing high hydrogen contents and activating atomic hydrogen by UV resulted in the enhancement of narrow channel effects in NMOS (positive charge accumulation at the transistor edges in the STI periphery).

Figure 4:
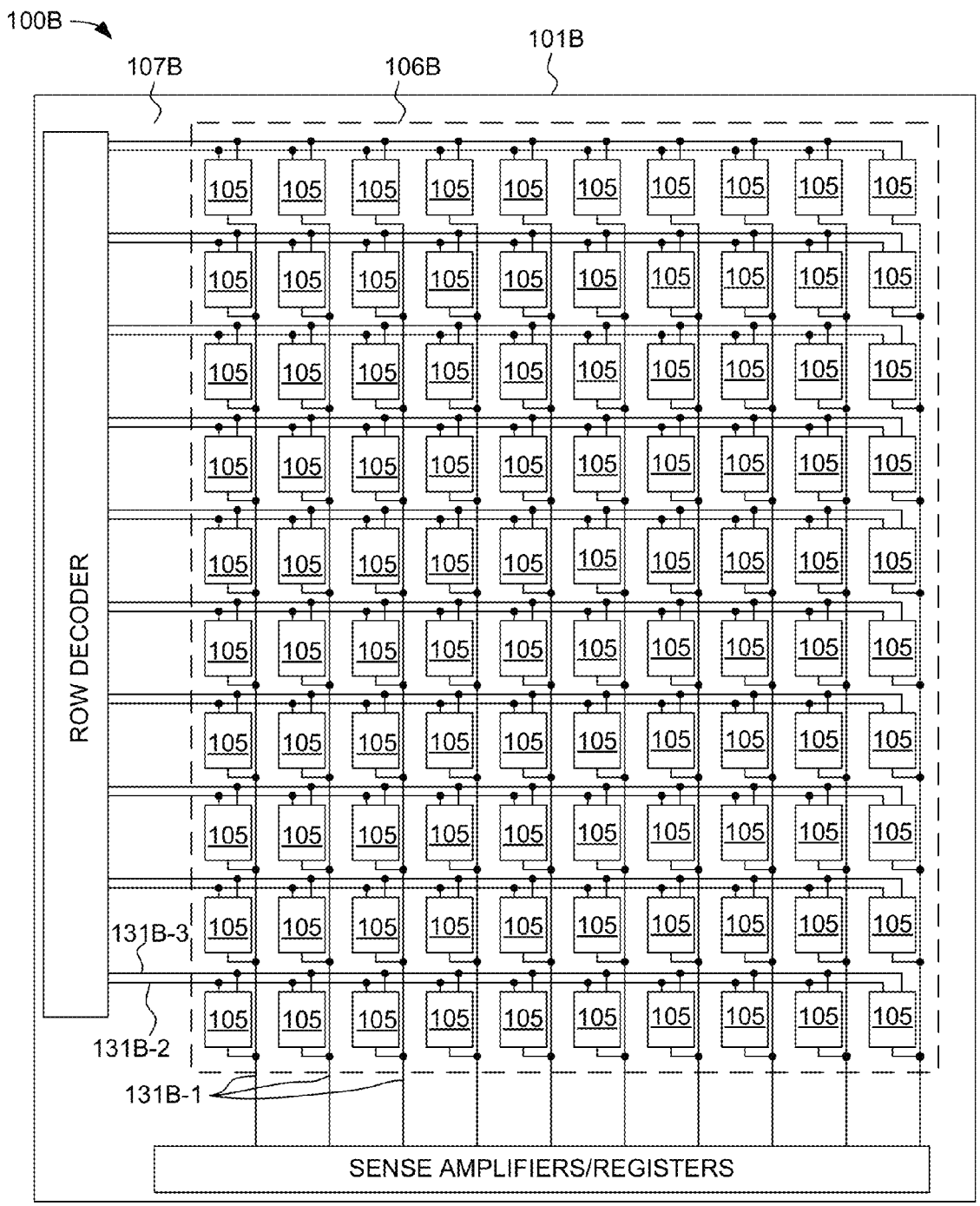
FIG. 4 is a block diagram showing an image sensor.
Figure 5A:
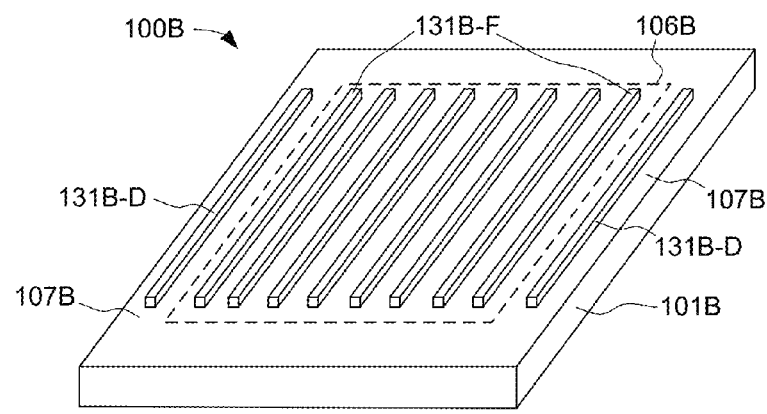
FIGS. 5(A), 5(B) and 5(C) are simplified perspective views showing a strategy for controlling hydrogen generation using dummy metal structures.
Figure 5B:
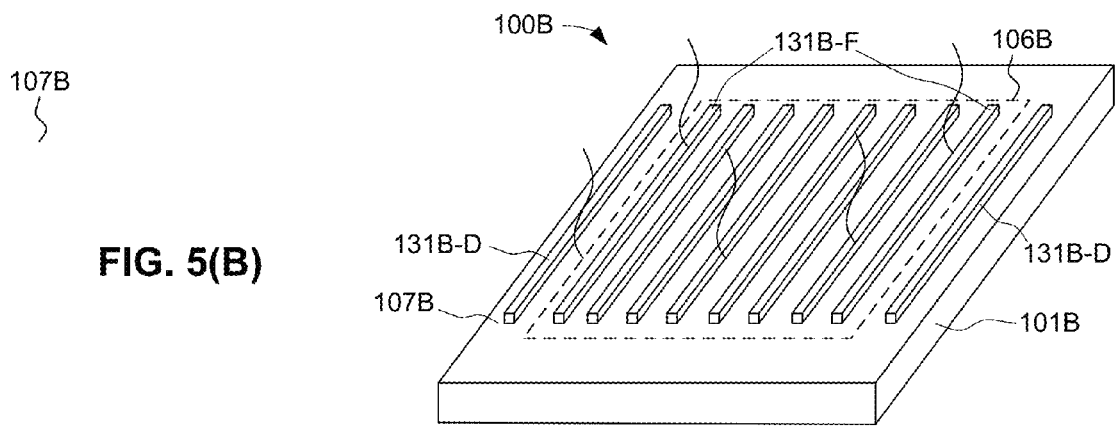
Figure 5C:
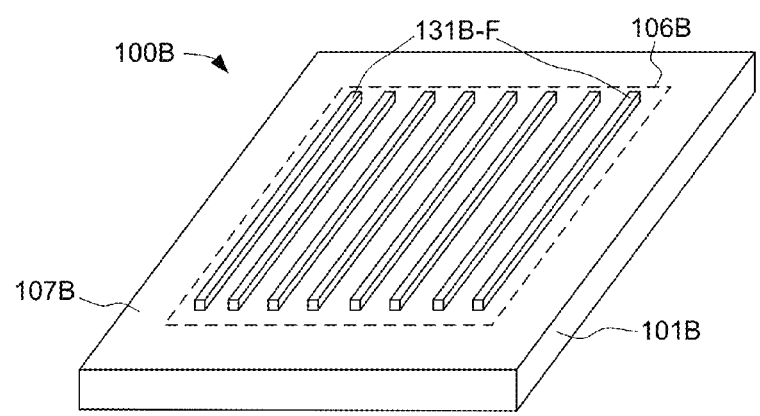
Figure 6A:
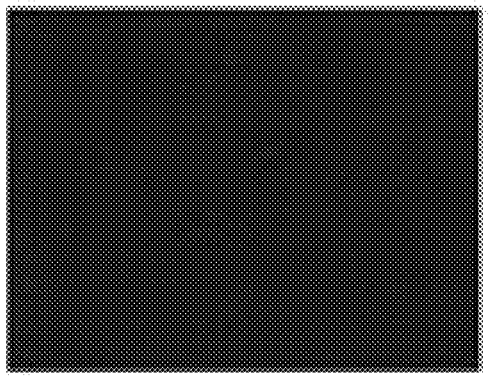
FIGS. 6(A), 6(B), 6(C) and 6(D) are diagrams indicating images produced by prior art image sensors.
Figure 6B:
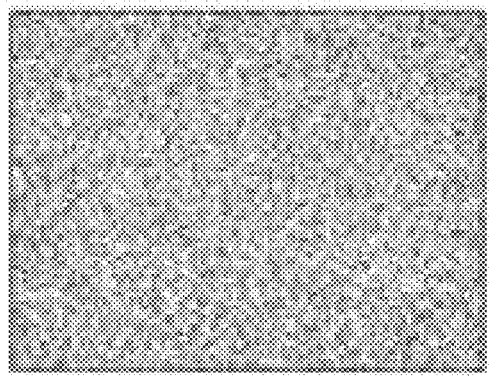
Figure 6C:
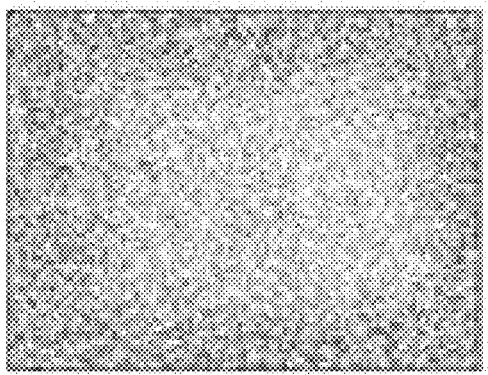
Figure 6D:
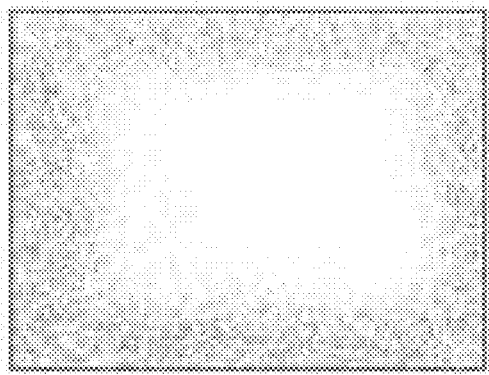

Additional strategies may be utilized in conjunction with the methodology described above to further improve the performance of image sensors. For example, FIG. 4 depicts a simplified diagram showing an image sensor (semiconductor integrated circuit) 100B having an array of image sensing pixels 105B disposed inside a rectangular imaging region 105 of said semiconductor substrate 101B, with control circuitry (e.g., row decoders, sense amplifiers and registers) located in peripheral region 107B (i.e., outside rectangular region 106B). FIG. 5(A) is a simplified diagram depicting substrate 101B during back-end processing, and in particular immediately after a first aluminum etch is performed to generate a patterned aluminum structure 131B-1 including functional patterned aluminum structures 131B-F (i.e., metal wires that, upon completion of the fabrication process, are electrically coupled to the array of image sensing pixels shown in FIG. 4), and non-functional "dummy" patterned aluminum structures 131B-D. Note that functional patterned aluminum structures 131B-F are formed over an interior of rectangular imaging region 106B in order to facilitate connection to the image sensing pixels, and "dummy" patterned aluminum structures 131B-D are formed in exterior region 107B (i.e., outside of rectangular region 106B). The purpose of "dummy" patterned aluminum structures 131B-D is to generate the same level of hydrogen ions (i.e., due to aluminum etch) in regions outside the periphery of the imaging region (i.e., outside rectangular region 106B) in order to avoid the problems described above with reference to FIGS. 6(A) to 6(D). That is, the present inventors found that the hydrogen generation/migration effect was especially strong in the peripheral imaging regions of CMOS image sensors, where the density of Al lines (metal line edges) was especially high. The inventors attribute this to detailed balance principle: the rate of hydrogen release from dangling bonds is lower for higher hydrogen atom content (the released from dangling bonds hydrogen atoms may be substituted by identical hydrogen ions residing in the vicinity of the dangling bond). By providing "dummy" patterned aluminum structures 131B-D in the peripheral regions of the imaging region, the level of hydrogen generation/migration was found to be balanced. As indicated in FIG. 5(B), after the aluminum etch is completed (i.e., after forming functional patterned aluminum structures 131B-F and non-functional patterned aluminum structures 131B-D), an anneal is performed in order to generate additional amounts of hydrogen that serve as passivation for dangling bonds in CIS devices. Together with engineering of the cap layer, this bake is a tool for tuning the amount of hydrogen in image sensor devices. As indicated in FIG. 5(C), the "dummy" aluminum structures are then removed using known techniques. Subsequently, ILD material is deposited over remaining functional patterned aluminum structures 131B-F in the manner described above.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for fabricating a semiconductor integrated circuit, the method comprising:
    generating front-end structures including one or more doped diffusion regions disposed in a semiconductor substrate, one or more polycrystalline silicon structures disposed over a surface of the substrate, and a pre-metal dielectric layer over the one or more polycrystalline silicon structures;
    forming a plurality of metallization layers over the pre-metal dielectric layer, wherein forming at least one of said metallization layers includes:
        forming a patterned metal structure;
        forming an interlevel dielectric (ILD) layer comprising a TEOS-based oxide over the patterned metal structure; and
        forming a cap layer over the ILD layer over said ILD layer of all of said plurality of metallization layers except an uppermost said metallization layer,
    wherein forming the cap layer comprises forming a high-density, low-moisture content oxide material having a minimum thickness of 100 A.

2. The method of claim 1,
    wherein forming said patterned metal structure of each of said plurality of metallization layers comprises forming an aluminum layer and then etching said aluminum layer,
    wherein forming said ILD layer of at least one of said metallization layers comprises forming one or more of Undoped silicate glass (USG) and Fluorosilicate glass (FSG), and
    wherein forming the cap layer over said ILD layer of said all of said plurality of metallization layers except said uppermost metallization layer comprises generating silane oxide by way of reacting silane ($SiH_4$) gas and oxygen ($O_2$) gas.

3. The method of claim 2, wherein generating said silane oxide comprising forming a layer of said silane oxide having a thickness in the range of 500 A to 5000 A.

4. The method of claim 2,
    wherein forming sequential first and second metallization layers of said plurality of metallization layers comprises:
    forming a first said cap layer over said ILD layer of said first metallization layer such that said first cap layer comprises a TEOS-based oxide, and
    forming a second said cap layer over said ILD layer of said second metallization layer such that said second cap layer comprises silane oxide.

5. The method of claim 1,
    wherein forming the pre-metal dielectric layer comprises forming a layer consisting essentially of one or more of BPSG and a TEOS-based oxide, and
    wherein forming the method further comprises forming an additional cap layer between said pre-metal dielectric layer and a lowermost metallization layer of said plurality of metallization layers, wherein said additional cap layer consists of silane oxide.

6. The method of claim 5, wherein forming a first patterned metal structure of a said lowermost metallization layer of said plurality of metallization layers comprises:
    forming a first aluminum layer on said additional cap layer; and
    etching a portion of said first aluminum layer such that an etch front passes through said first aluminum layer and enters said silane oxide layer, and such that said etching is terminated when a minimum thickness of said silane oxide layer between an upper surface of said pre-metal dielectric layer and said etch front is greater than 100 A.

7. The method of claim 6, further comprising:
    forming a first ILD layer of said lowermost metallization layer over said etched first aluminum layer, said first ILD layer comprising one or more of Undoped silicate glass (USG) and Fluorosilicate glass (FSG), and
    forming a first cap layer over said first ILD layer by generating silane oxide by way of reacting silane ($SiH_4$) gas and oxygen ($O_2$) gas, and forming a second patterned aluminum structure of a second metallization layer of said plurality of metallization layers on said first cap layer, said forming comprising:
forming a second aluminum layer on said first cap layer; and
etching a portion of said second aluminum layer such that an etch front passes through said second aluminum layer and enters said first cap layer, and such that said etching is terminated when a minimum thickness of said first cap layer between an upper surface of said first ILD layer and said etch front is greater than 100 A.

8. The method of claim 1,
wherein forming the pre-metal dielectric layer comprises forming a layer consisting essentially of one or more of BPSG and a TEOS-based oxide, and
wherein the method further comprises a barrier layer disposed between said polycrystalline silicon structures and a lowermost metallization layer of said plurality of metallization layers, wherein said barrier layer comprises one of silicon nitride and silicon oxy-nitride.

9. The method of claim 1, wherein forming said ILD layer of each said metallization layer comprises depositing a TEOS-based oxide USG/FSG, then annealing said deposited TEOS-based oxide, and then planarizing said annealed TEOS-based oxide before forming said cap layer.

10. The method of claim 1, wherein forming said ILD layer of at least one of said metallization layers comprises depositing a TEOS-based oxide, and then processing said TEOS-based oxide in a hydrogen plasma before forming said cap layer.

11. The method of claim 1, further comprising, after forming an uppermost ILD layer of an uppermost metallization layer of said plurality of metallization layers, annealing said uppermost ILD layer at temperature in the range 350-450° C. before performing a pad etch.

12. The method of claim 1, further comprising, after forming an uppermost ILD layer of an uppermost metallization layer of said plurality of metallization layers, performing a pad etch, and then annealing said uppermost ILD layer at temperature in the range 350-450° C.

13. The method of claim 1, further comprising, while forming an uppermost ILD layer of an uppermost metallization layer of said plurality of metallization layers, directing UV radiation having wavelengths below 250 nm onto said uppermost ILD layer.

14. The method of claim 1, The method of claim 1, further comprising, while after forming an uppermost ILD layer of an uppermost metallization layer of said plurality of metallization layers, directing UV radiation having wavelengths below 250 nm onto said uppermost ILD layer, and annealing said uppermost ILD layer at temperature in the range 200-450° C.

15. The method of claim 1, wherein fabricating said semiconductor integrated circuit comprises fabricating one of a CMOS image sensor (CIS) and a charge-coupled device (CCD).

16. The method of claim 1, wherein fabricating said semiconductor integrated circuit comprises fabricating a radiation detector.

17. A method for fabricating a semiconductor integrated circuit, the method comprising:
generating front-end structures including one or more doped diffusion regions disposed in a semiconductor substrate, one or more polycrystalline silicon structures disposed over a surface of the substrate, and a pre-metal dielectric layer over the one or more polycrystalline silicon structures;
forming a plurality of metallization layers over the pre-metal dielectric layer, wherein forming at least one of said metallization layers includes:
forming a patterned metal structure;
forming an interlevel dielectric (ILD) layer comprising a TEOS-based oxide over the patterned metal structure; and
forming a cap layer over the ILD layer,
wherein forming the cap layer comprises forming a high-density, low-moisture content oxide material having a minimum thickness of 100 A,
wherein said semiconductor integrated circuit comprises an array of image sensing pixels disposed inside a rectangular imaging region of said semiconductor substrate, and
wherein forming said patterned metal structure of at least one of said plurality of metallization layers comprises forming functional patterned aluminum structures over an interior of said rectangular imaging region, and forming non-functional patterned aluminum structures over an exterior peripheral region surrounding said rectangular imaging region.

18. The method of claim 17, further comprising, after forming said functional and non-functional patterned aluminum structures, performing an anneal, and then removing said non-functional patterned aluminum structures.

19. An image sensor comprising:
a semiconductor substrate including a plurality of doped diffusion regions disposed below an upper substrate surface;
a plurality of polycrystalline silicon structures disposed on the semiconductor substrate over the upper substrate surface;
a pre-metal dielectric layer formed over the polycrystalline silicon structures; and
a back-end metallization structure formed on the pre-metal dielectric layer, the back-end metallization structure including a plurality of metallization layers formed in a stack, each of the metallization layers including a patterned aluminum layer and an interlevel dielectric (ILD) layer comprising TEOS-based oxide that is formed over the patterned aluminum layer,
wherein at least one of the plurality of metallization layers includes a cap layer formed on the ILD layer, and
wherein the cap layer of all of said plurality of metallization layers except an uppermost said metallization layer comprises a silane oxide layer having a minimum thickness of 100 A.

* * * * *